United States Patent
Boldt et al.

(10) Patent No.: US 7,292,479 B2
(45) Date of Patent: Nov. 6, 2007

(54) MEMORY DEVICE WITH MULTISTAGE SENSE AMPLIFIER

(75) Inventors: Sven Boldt, Aschheim (DE); Erwin Thalmann, Villach (AT)

(73) Assignee: Infineon Technolgoies AG, Munich (DE)

( * ) Notice: Subject to any disclaimer, the term of this patent is extended or adjusted under 35 U.S.C. 154(b) by 131 days.

(21) Appl. No.: 11/153,829

(22) Filed: Jun. 15, 2005

(65) Prior Publication Data

US 2005/0286316 A1    Dec. 29, 2005

(30) Foreign Application Priority Data

Jun. 23, 2004   (DE) .................. 10 2004 030 283

(51) Int. Cl.
*G11C 7/10* (2006.01)
(52) U.S. Cl. ................ 365/189.01; 365/149; 365/150; 365/189.02
(58) Field of Classification Search ........... 365/189.01, 365/149, 150, 189.02
See application file for complete search history.

(56) References Cited

U.S. PATENT DOCUMENTS

| 6,104,655 | A | 8/2000 | Tanoi et al. |
| 6,781,894 | B2 * | 8/2004 | Taito .......................... 365/198 |
| 2001/0028588 | A1 | 10/2001 | Yamada et al. |

OTHER PUBLICATIONS

German Office Action dated Mar. 22, 2005.

* cited by examiner

*Primary Examiner*—Richard T. Elms
*Assistant Examiner*—Pho M. Luu
(74) *Attorney, Agent, or Firm*—Jenkins, Wilson, Taylor & Hunt, P.A.

(57) ABSTRACT

A memory device with a multistage sense amplifier is disclosed. According to one aspect, a memory device has a memory cell array having at least one memory cell, at least one sense amplifier. Binary data signals read out from the memory cell are amplified and evaluated. The binary data signals can also be written back to the corresponding memory cell. Furthermore, an output unit for outputting the amplified and evaluated binary data signals and a coupling device between the memory cell array and the sense amplifier are provided. The coupling device has a preamplifier unit for preamplifying the data signals read out and a bridging unit for bridging the preamplifier unit in order to provide a writing back of the binary data signals to the memory cell of the memory cell array.

8 Claims, 2 Drawing Sheets

MEMORY DEVICE WITH MULTISTAGE SENSE AMPLIFIER

TECHNICAL FIELD

The present invention relates generally to electronic memory modules designed for electronically storing binary data. The present invention specifically relates to a memory device for storing binary data signals in a memory cell array having at least one memory cell which can be addressed via word lines and bit lines, it being possible to store the binary data signals in the form of electronic charges, at least one sense amplifier, by means of which the stored binary data signals can be read out from the at least one memory cell, the data signals read out subsequently being amplified and evaluated by means of the sense amplifier and being written back to the corresponding memory cell, and an output unit for outputting the amplified and evaluated data signals.

BACKGROUND ART

In a use of electronic memory modules (memory chips, memory devices), it is important for an energy consumption not to rise in particular when there is an increase in the integration density.

FIG. 2 schematically shows a conventional memory device, a memory cell being illustrated schematically in the form of a capacitor C. In order to write an item of information to the memory cell C or in order to read the information from the memory cell C, it is necessary firstly to activate the corresponding word line WL. As a result of such activation, the transistor T is turned on and the stored charge in the capacitor corresponding to the stored information passes onto the lower bit line BLt illustrated in FIG. 2. Consequently, the potential difference between two bit lines, i.e. the bit line BLt connected to the transistor and a second bit line BLc, is altered. Before the memory cell C is addressed, the two bit lines have approximately an identical potential, while a potential difference between the bit line BLt and the bit line BLc (for example with respect to ground) is brought about during an addressing of the transistor T, which is connected to the memory cell C, via the word line WL.

The potential difference thus engendered between the bit line BLt and the bit line BLc is amplified and evaluated in a sense amplifier SA and subsequently written back again to the memory cell in order to maintain the information (electrical charge) stored in the memory cell for a relatively long time. Such reading of the information from the memory cell and writing of the information read out back to the memory cell is also referred to as a refresh mode, which, by way of example, has to be carried out at intervals of 64 milliseconds (ms) in the case of conventional memory cells.

The reading out and rewriting (writing back) of information (electrical charge) from and to the memory cell of a memory cell array is controlled by a central control unit of the memory device. In this case, current is required, i.e. electrical energy is consumed, for each memory cell of a memory cell array both when the information is read out and when the information is written back to the memory cell. In an inexpedient manner, all of the memory cells C of a memory cell array in a conventional memory device are connected directly to the sense amplifier SA, which is always designed in such a way that the potential difference is amplified and evaluated in the sense amplifier and subsequently written back again to the memory cell C.

In many applications, however, the information stored in the memory cell C is only required a single time, such that writing the information back to the memory cell C is superfluous. By way of example, in applications such as, for instance, in computation operations, it is merely necessary to maintain an item of information in the memory cell until the information is read out from the memory cell. After a single read-out, the information read out is processed, but is no longer required in the memory cell. Therefore, it is not necessary for the information read out to be written back to the corresponding memory cell of the memory cell array. If the writing-back operation (rewriting operation) is nevertheless performed, then a high current consumption and thus a high energy consumption of the overall memory device result, in a disadvantageous manner.

SUMMARY OF THE INVENTION

Consequently, it is an object of the present invention to provide a memory device in which an energy consumption is reduced and which can prevent a writing back of an item of information to a memory cell of the memory cell array in a predeterminable manner.

This object is achieved according to the invention by means of a memory device having the features of patent claim 1.

Furthermore, the object is achieved by means of a method specified in patent claim 6.

Further refinements of the invention emerge from the subclaims.

One essential concept of the invention consists in separating the memory cell array containing the memory cells from the sense amplifier by means of a coupling device, the coupling device being designed in such a way that it optionally prevents a writing back of the information to the memory cells of the memory cell array. According to the invention, a preamplifier unit is provided in the coupling device and, in combination with the sense amplifier arranged outside the coupling device, provides a multistage amplifier.

The preamplifier unit of the coupling device is preferably designed in unidirectional fashion, i.e. the preamplifier unit of the coupling device makes it possible to read out binary data signals from addressed memory cells of a memory cell array but not to support the rewriting operation of the sense amplifier by means of the preamplifier unit. If a rewriting operation is performed on the part of the sense amplifier, then the preamplifier unit of the coupling device expediently provides a decoupling of the memory cell array from the sense amplifier in such a way that no energy has to be provided for a rewriting operation.

Consequently, one advantage of the present invention is that a writing back of the memory cell information is prevented. This expediently reduces a total current consumption of the memory device and thus a total energy consumption of the memory device.

The memory device according to the invention for storing binary data signals essentially has:

a) a memory cell array having at least one memory cell which can be addressed via word lines and bit lines, it being possible to store the binary data signals in the form of electrical charges;

b) at least one sense amplifier, by means of which the stored binary data signals can be read out from the at least one memory cell, the binary data signals read out subsequently being amplified and evaluated by means of the sense amplifier and also being able to be written back to the corresponding memory cell; and c) an output unit for outputting the amplified and evaluated binary data signals, the memory device for storing binary data signals further having a coupling device connected between the memory cell array and the sense amplifier, which coupling device comprises at least one preamplifier unit for preamplifying the data signals read out from the at least one memory cell of the memory cell array and for outputting the preamplified data signals to the sense amplifier; and a bridging unit for bridging the preamplifier unit in order to provide a writing-back of the binary data signals to the corresponding memory cells of the memory cell array.

Furthermore, the method according to the invention for storing and reading out binary data signals in and from a memory cell array comprising memory cells essentially has the following steps of:

a) addressing at least one memory cell of the memory cell array via word lines and bit lines;

b) storing the binary data signals in the form of electrical charges in the at least one addressed memory cell of the memory cell array;

c) reading out the stored binary data signals from at least one memory cell addressed for the read-out via at least one data line by means of a sense amplifier;

d) amplifying the data signals read out by means of the sense amplifier; and e) outputting the amplified binary data signals by means of an output unit, the method further carrying out the steps of preamplifying, prior to step d) of amplifying the binary data signals read out by means of the sense amplifier, the binary data signals read out from the at least one memory cell of the memory cell array, and outputting the preamplified binary data signals to the sense amplifier by means of a preamplifier unit provided in a coupling device connected between the memory cell array and the sense amplifier; and bridging, if the binary data signals are intended to be written back to the memory cell, the preamplifier unit by means of a bridging unit provided in the coupling device connected between the memory cell array and the sense amplifier.

Advantageous developments and improvements of the respective subject-matter of the invention are found in the subclaims.

In accordance with one preferred development of the present invention, the bridging unit has at least one multiplexing unit, which can be activated with a write signal. What is preferably achieved by the activation of the at least one multiplexing unit is that binary data signals can be rewritten from the sense amplifier arranged outside the coupling device to the corresponding memory cell of the memory cell array.

In accordance with yet another preferred development of the present invention, a separate multiplexing unit is provided for each data line connecting the memory cell array to the sense amplifier. Preferably, in the case of two bit lines, four multiplexing units are provided, i.e. two multiplexing units for separating the two bit lines from the input of the preamplifier unit and two multiplexing units for separating the output of the preamplifier unit from two data lines connecting the coupling device to the sense amplifier.

Preferably, the at least one sense amplifier and the at least one preamplifier unit are adapted to one another in such a way that a multistage amplifier device is provided.

In accordance with yet another preferred development of the present invention, the data signals read out are evaluated in the sense amplifier prior to step e) of outputting the amplified binary data signals by means of the output unit. Such an evaluation means that slight potential differences between the two bit lines are used for interpreting a binary state of the binary data signal read out.

When a specific memory cell is addressed via a word line, a charge is thus applied to the corresponding bit line via the switching transistor assigned to the memory cell, in such a way that a potential difference arises between the two bit lines, and can subsequently be evaluated in the sense amplifier.

In accordance with yet another preferred development of the present invention, at least one multiplexing unit is provided in the bridging unit, which multiplexing unit is activated with a write signal. Preferably, the sense amplifier is simultaneously activated by means of the write signal, in such a way that a bridging is brought about which, even when the coupling device is present, permits a writing back of an item of information (of binary data signals read out), to the relevant memory cell of the memory cell array.

In accordance with yet another preferred development of the present invention, each data line is switched through by means of a corresponding driving of the multiplexing unit assigned thereto with the write signal.

In accordance with yet another preferred development of the present invention, a bridging of the preamplifier unit of the coupling device in order to provide a rewriting of the binary data signals to the memory cells of the memory cell array is carried out by means of the bridging unit in a manner dependent on a write signal fed to the bridging unit.

In accordance with yet another preferred development of the present invention, the binary data signals read out from the at least one addressed memory cell by means of the sense amplifier are no longer written back, i.e. rewritten, to the corresponding memory cell of the memory cell array after read-out.

In accordance with yet another preferred development of the present invention, the binary data stored in the at least one addressed memory cell of the sense amplifier are provided only for a single read-out.

In accordance with yet another preferred development of the present invention, without a bridging of the preamplifier unit by means of the bridging unit provided in the coupling device connected between the memory cell array and the sense amplifier, a writing back, i.e. a rewriting, of the binary data signals from the sense amplifier to the corresponding memory cells of the memory cell array is prevented.

Exemplary embodiments of the invention are illustrated in the drawing and are explained in more detail in the description below.

DETAILED DESCRIPTION OF THE INVENTION

In the figures, identical reference symbols designate identical or functionally identical components or steps.

Figure 1:
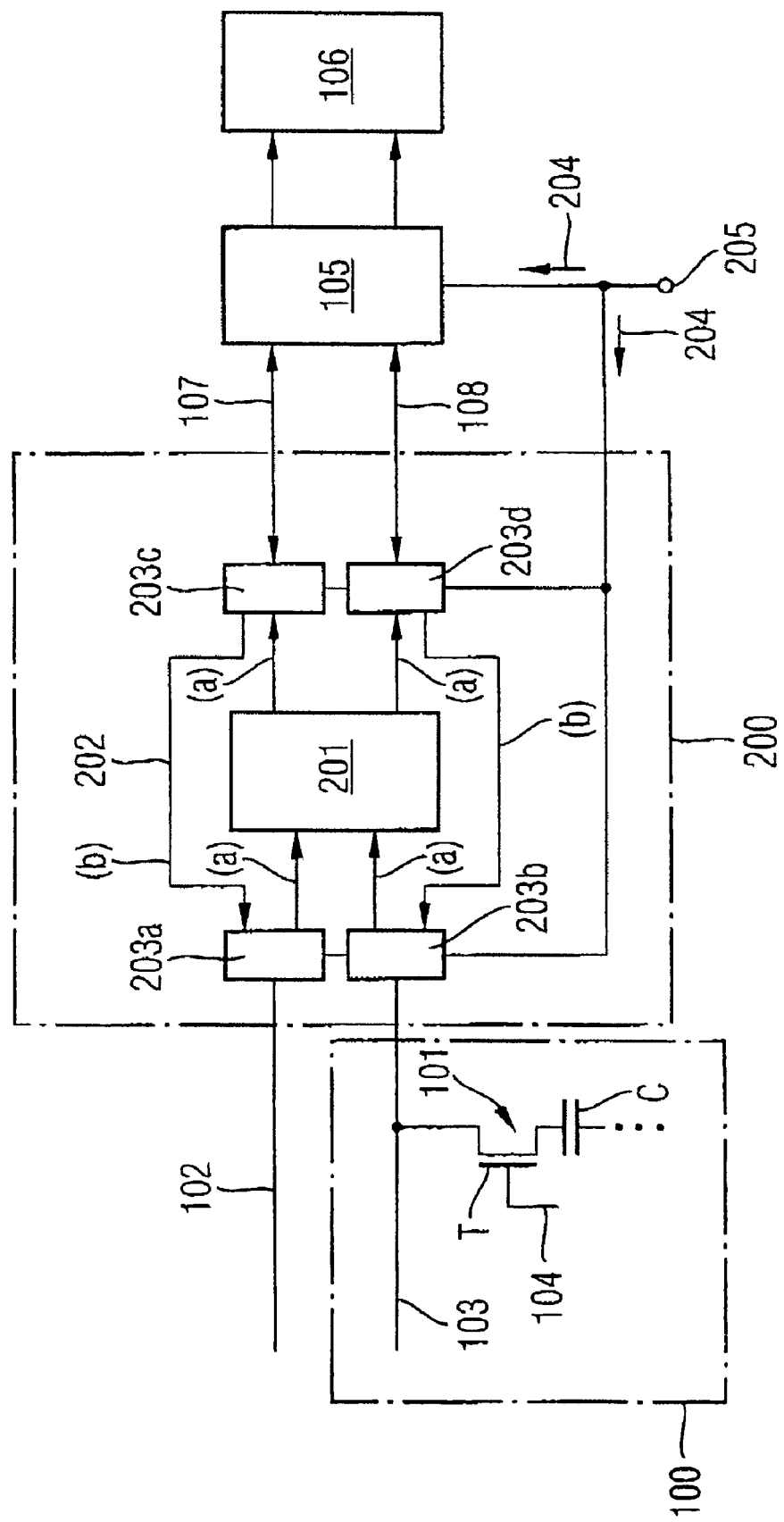
FIG. 1 shows a block diagram of a memory device in which a coupling device is connected between a memory cell array and a sense amplifier, in accordance with a preferred exemplary embodiment of the present invention.

FIG. 1 illustrates a schematic block diagram of a preferred exemplary embodiment of a memory device for storing binary data signals.

A reference symbol 100 designates a memory cell array of the memory device, which has at least one memory cell 101.

It should be pointed out here that the memory cell illustrated by a transistor T and a capacitor C is only by way of example, and that the memory device according to the invention and the method according to the invention for storing binary data signals can be designed with one or more memory cells 101 of the memory cell array.

The memory device in accordance with the preferred exemplary embodiment of the present invention is preferably designed on the basis of a dynamic random access memory (DRAM), but it should be pointed out that the present invention is not restricted to a DRAM memory device. In the memory cell array, each individual memory cell 101 can be addressed via a word line and a bit line. If a memory cell 101 of this type is addressed, then the stored information, which is stored in the form of an electrical charge in the capacitor C, can be read out. During a read-out, the memory cell information is usually amplified first, then evaluated and the same information is subsequently rewritten to the memory cell.

An explanation is given below of the method according to the invention using a coupling device 200.

In order to read out the information (designated here as binary data signal) stored in a memory cell 101 of the memory cell array 104, it is necessary firstly to activate the corresponding word line 104 of the memory cell 101. As a result of such activation, the transistor T assigned to the memory cell C is put into an on state, whereupon the electrical charge stored in the capacitor C of the memory cell 101 passes onto the lower bit line 103 shown in FIG. 1.

It should be pointed out that it is assumed that the two bit lines 102, 103 shown in FIG. 1 have been held at an identical potential with respect to a reference potential, for example the ground potential, before the information stored in the memory cell 101 is read out. A connection of the capacitor C of the memory cell 101 to the lower bit line 103 by means of an addressing of the transistor T brings about a potential difference between the two bit lines 102 and 103. Such a potential difference between the two bit lines 102 and 103 produces the binary data signal read out, which is fed to a corresponding data signal amplifier, i.e. a sense amplifier 105 arranged downstream of the coupling device 200.

In the sense amplifier, the potential difference, i.e. the binary data signal, is amplified and evaluated and written back in the direction of the memory cell 101 of the memory cell array by means of a fixedly programmed operation.

The coupling device 200 according to the invention, which is connected between the memory cell array 100 and the sense amplifier 105, will be described in more detail below.

In the preferred exemplary embodiment of the present invention, the coupling device 200 comprises a preamplifier unit 201 and four multiplexing units 203a-203d. The four multiplexing units 203a-203d form a bridging unit 202 for the preamplifier unit 201. The preamplifier unit 201 forms an input stage for the sense amplifier 105 in such a way that a multistage amplifier is formed. In this case, the at least one sense amplifier 105 arranged in the memory device and the at least one preamplifier unit 201 arranged in the coupling device 200 are provided as a multistage amplifier device. The preamplifier unit 201 itself may in turn be formed as a multistage amplifier, although only one circuit block of a preamplifier unit 201 is illustrated in FIG. 1 in order to simplify the illustration.

The read-out mode for a binary data signal stored in a memory cell 101 of the memory cell array 100 will be explained first of all. The memory cell 101 is firstly addressed via the word lines 104 and the bit lines 102 and 103. It shall be assumed that a binary data signal in the form of electrical charges has been stored in the memory cell 101 of the memory cell array 100 prior to an addressing. In a next step, the stored binary data signal is read out from the addressed memory cell 101, this binary data signal read out being fed to the sense amplifier 105 via the coupling device 200 and two data lines 107 and 108.

During a read-out of an item of information (of stored binary data signals) from the memory cell 101, use is made of the data path designated by the reference symbol (a) in FIG. 1 from the bit lines 102 and 103 via the first two multiplexing units 203a, 203b to the input of the preamplifier unit 201 and further from the output of the preamplifier unit 201 via the second two multiplexing units 203c, 203d to the data lines 107 and 108.

Figure 2:
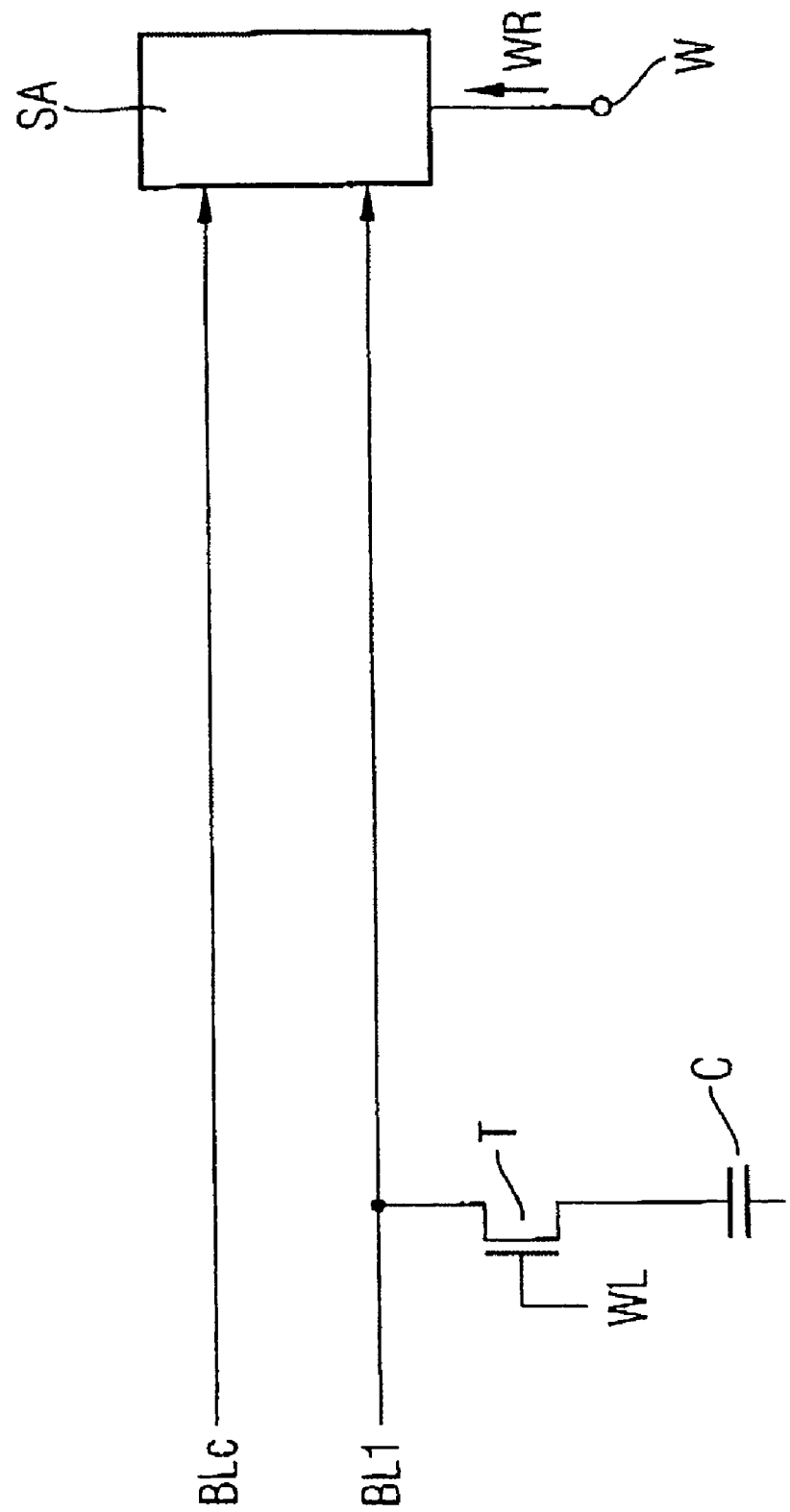
FIG. 2 shows a conventional memory device.

That is to say that the multiplexing units 203a-203d are connected in such a way that, on the one hand, the two bit lines 102, 103 are connected to the two input terminals of the preamplifier unit 201, and, on the other hand, the two output terminals of the preamplifier unit 201 are connected to the two data lines 107, 108. A read mode such as may also be provided by a conventional memory device shown in FIG. 2 is made possible in this way. However, the additional advantage of the memory device shown in FIG. 1 over a memory device according to the prior art consists in the fact that the coupling unit 200 provides a preamplifier unit 201 for preamplifying the read-out binary data signal that is to be fed to the sense amplifier 105.

As already described, the sense amplifier 105 effects a further amplification, an evaluation and a subsequent writing-back operation for the binary data signals read out from the memory cell 101. Since the preamplifier unit 201 of the coupling device 200 is designed as a unidirectional unit, i.e. signals are conducted only from an input of the preamplifier unit 201—amplified—to the output of the preamplifier unit 201, it being possible for the output of the preamplifier unit 201 to be designed with high impedance in a simple manner.

If the sense amplifier initiates a writing back of the binary data signals read out, then the high-impedance output of the preamplifier unit 201 provides a blocking of the fed-back signal, in such a way that no appreciable current can be driven during the writing-back operating step. A current consumption, i.e. a total energy consumption when writing back an item of information to the memory cell 101 of the memory cell array 100 is avoided in this way. Consequently, the essential advantage is afforded that, even if a writing back (rewriting) of an item of information read out to the memory cell is attempted as a result of the conventional design of sense amplifiers 105 contained in the memory device, no current is consumed during an operation of this type, i.e. renewed charge does not pass into the memory cell during the rewriting operation. This means that no current flows during the rewriting operation and the energy consumption is thus considerably reduced in comparison with the conventional circuit arrangement during the entire read-out operation.

The coupling device 200 according to the invention is advantageous particularly in applications such as in computation operations in which an item of information contained in the memory cells 101 of the memory cell array 100 is required only once, i.e. at the point in time of the read-out. After a single read-out, the information is no longer required, from which it follows that the information read out does not have to be written back to the memory cells 101.

The coupling device 200 according to the invention is preferably designed in such a way that for the case where it is necessary for an item of information to be written back to the relevant memory cell 101 of the memory cell array 100, a bridging of the preamplifier unit 201 can be provided. The four multiplexing units 203a-203d illustrated in FIG. 1 serve for this purpose.

The data path shown with the reference symbol (b) in FIG. 1 is used when an item of information is written back from the sense amplifier 105 to the corresponding memory cell 101 of the memory cell array 100. The changeover of the multiplexing units 203a-203d in such a way that the signal applied by the sense amplifier 105 is now not transferred back on the data path (a), but rather is transferred on the data path (b), is effected by means of a write signal 204 that is fed to the memory device via a write signal input 205. The write signal 204 simultaneously serves for driving the sense amplifier 105, that is customary in memory devices according to the prior art.

If the data path (b) is used when an item of information is written back, then the preamplifier unit 201 is bridged by the data path (b) and the four multiplexing units 203a-203d, as shown in FIG. 1. In a preferred exemplary embodiment of the present invention, the four multiplexing units 203a-203d may be designed as electronic switches.

Without a bridging of the preamplifier unit 201 by means of the bridging unit 202 formed by the four multiplexing units 203a-203d, a writing back of the binary data signals from the sense amplifier 105 to the corresponding memory cells 101 of the memory cell array 100 would be prevented.

The binary data signals that have been amplified and evaluated by means of the sense amplifier 105 are output by means of an output unit 106 of the memory device according to the invention.

It should be pointed out that the sense amplifier 105 and also the preamplifier unit 201 are designed as differential amplifiers in order to be able to amplify a corresponding potential difference which is generated between the bit lines 102 and 103 when an item of information stored in a memory cell 101 is read out.

With regard to the conventional memory device illustrated in FIG. 2, reference is made to the introduction to the description.

Although the present invention has been described above on the basis of preferred exemplary embodiments, it is not restricted thereto, but rather can be modified in diverse ways.

Moreover, the invention is not restricted to the application possibilities mentioned.

LIST OF REFERENCE SYMBOLS

In the figures, identical reference symbols designate identical or functionally identical components or steps.

| | | |
|---|---|---|
| 100 | Memory cell array | |
| 101 | Memory cell | |
| 102, 103 | Bit lines | |
| 104 | Word line | |
| 105 | Sense amplifier | |
| 106 | Output unit | |
| 107, 108 | Data line | |
| 200 | Coupling device | |
| 201 | Preamplifier unit | |
| 202 | Bridging unit | |
| 203a-203d | Multiplexing units | |
| 204 | Write signal | |
| 205 | Write signal input | |

What is claimed is:

1. Memory device for storing binary data signals, having:
   a) a memory cell array having at least one memory cell which can be addressed via word lines and bit lines, it being possible to store the binary data signals in the form of electrical charges;
   b) at least one sense amplifier, by means of which the stored binary data signals can be read out from the at least one memory cell, the binary data signals read out subsequently being amplified and evaluated by means of the sense amplifier and also being able to be written back to the corresponding memory cell;
   c) an output unit for outputting the amplified and evaluated binary data signals, wherein
   d) the memory device for storing binary data signals further has a coupling device connected between the memory cell array and the sense amplifier, which coupling device comprises:
   d1) at least one preamplifier unit for preamplifying the data signals read out from the at least one memory cell of the memory cell array and for outputting the preamplified data signals to the sense amplifier; and
   d2) a bridging unit for bridging the preamplifier unit in order to provide a writing-back of the binary data signals to the corresponding memory cells of the memory cell array, wherein the bridging unit has at least one multiplexing unit, which can be activated with a write signal and which is provided separately for each data line.

2. Device according to claim 1, wherein the at least one sense amplifier and the at least one preamplifier unit are provided as a multistage amplifier device.

3. Device according to claim 1, wherein the preamplifier unit is designed as a multistage amplifier.

4. Method for storing and reading out binary data signals in and from a memory cell array comprising memory cells, having the following steps of:
   a) addressing at least one memory cell of the memory cell array via word lines and bit lines;
   b) storing the binary data signals in the form of electrical charges in the at least one addressed memory cell of the memory cell array;
   c) reading out the stored binary data signals from at least one memory cell addressed for the read-out via at least one data line by means of a sense amplifier;
   d) amplifying the data signals read out by means of the sense amplifier; and
   e) outputting the amplified binary data signals by means of an output unit, wherein the method further has the following steps of:
   f) preamplifying, prior to step d) of amplifying the binary data signals read out by means of the sense amplifier, the binary data signals read out from the at least one memory cell of the memory cell array, and outputting the preamplified binary data signals to the sense amplifier by means of a preamplifier unit provided in a coupling device connected between the memory cell array and the sense amplifier; and
   g) bridging, if the binary data signals are intended to be written back to the memory cell, the preamplifier unit by means of a bridging unit provided in the coupling device connected between the memory cell array and the sense amplifier, wherein
   g1) at least one multiplexing unit is provided in the bridging unit, which multiplexing unit is activated with a write signal;

g2) each data line is switched through by means of a separate multiplexing unit; and g3) a bridging of the preamplifier unit in order to provide a rewriting of the binary data signals to the memory cells of the memory cell array is carried out by means of the bridging unit in a manner dependent on the write signal fed to the bridging unit.

5. Method according to claim 4, wherein the data signals read out are evaluated in the sense amplifier prior to step e) of outputting the amplified binary data signals by means of the output unit.

6. Method according to claim 4, wherein the binary data signals read out from the at least one addressed memory cell by means of the sense amplifier are no longer written back to the corresponding memory cell of the memory cell array after read-out.

7. Method according to claim 6, wherein the binary data signals stored in the at least one addressed memory cell of the sense amplifier are provided only for a single read-out.

8. Method according to claim 4, wherein without a bridging of the preamplifier unit by means of the bridging unit provided in the coupling device connected between the memory cell array and the sense amplifier, a writing back of the binary data signals from the sense amplifier to the corresponding memory cells of the memory cell array is prevented.

* * * * *